(12) United States Patent
Lin et al.

(10) Patent No.: US 8,035,034 B2
(45) Date of Patent: Oct. 11, 2011

(54) PRINTED CIRCUIT BOARD

(75) Inventors: Yu-Hsu Lin, San Jose, CA (US);
Jeng-Da Wu, Taipei Hsien (TW);
Chih-Hang Chao, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 784 days.

(21) Appl. No.: 12/118,658

(22) Filed: May 9, 2008

(65) Prior Publication Data

US 2009/0188699 A1 Jul. 30, 2009

(30) Foreign Application Priority Data

Jan. 24, 2008 (CN) .......................... 2008 1 0300203

(51) Int. Cl.
*H05K 1/03* (2006.01)
(52) U.S. Cl. ......... 174/255; 174/261; 361/777; 361/778
(58) Field of Classification Search .................. 174/250, 174/255, 260, 256, 258, 261; 361/760, 777, 361/778; 257/786, 776, 773
See application file for complete search history.

(56) References Cited

U.S. PATENT DOCUMENTS

| 5,780,366 | A | * | 7/1998 | Appelt et al. ................... 442/19 |
| 6,852,395 | B2 | * | 2/2005 | Dhawan et al. ............... 428/196 |
| 7,056,571 | B2 | * | 6/2006 | Tomekawa et al. ........... 428/209 |
| 2004/0181764 | A1 | * | 9/2004 | Brist et al. ....................... 716/6 |
| 2004/0262036 | A1 | * | 12/2004 | Brist et al. ..................... 174/261 |
| 2005/0034893 | A1 | * | 2/2005 | McCall et al. ................. 174/255 |
| 2006/0076683 | A1 | * | 4/2006 | Nishida ......................... 257/758 |
| 2006/0254811 | A1 | * | 11/2006 | Kirstein et al. ............... 174/256 |
| 2007/0223205 | A1 | * | 9/2007 | Liang et al. ................... 361/760 |
| 2008/0060836 | A1 | * | 3/2008 | Farkas et al. .................. 174/250 |

FOREIGN PATENT DOCUMENTS

| DE | 19721087 A1 | 11/1998 |
| WO | 2007109483 A1 | 9/2007 |

* cited by examiner

*Primary Examiner* — Hoa C Nguyen
(74) *Attorney, Agent, or Firm* — Altis Law Group, Inc.

(57) ABSTRACT

A printed circuit board includes a base and a signal trace laid on the base. The signal trace includes a plurality of straight line segments parallel to the first fibers. The signal trace is laid on the base in such a manner that the line segments of the signal trace mapped on the base partly superpose the first fibers and partly superpose gaps between two adjacent first fibers.

10 Claims, 6 Drawing Sheets

PRINTED CIRCUIT BOARD

BACKGROUND

1. Technical Field

The present invention relates to a printed circuit board, and more particularly to a printed circuit board having high signal transmission quality.

2. General Background

A printed circuit board (PCB) typically consists of a base, resin, and copper foil. The base for the PCB is often constructed from woven glass fiber cloth. During the process of manufacturing the PCB, the base is treated by passing it through a dip pan containing resin. The treated base is then passed through a set of squeeze rollers, and then a drying oven to cure. Then, the base is cut into a desired PCB size. Once the base has been prepared, copper foil is applied to one or two sides of the base, typically by electrodeposition. The copper foil is etched to form different signal traces on the PCB.

Referring to FIGS. 1 and 2, a PCB 1 includes a base 10 which includes a set of first fibers 11 and a second set of second fibers 12. The PCB 1 defines an X-axis extending in a horizontal direction, and a Y-axis perpendicular to the X-axis. The first fibers 11 of the base 10 disposed in the X-axis direction are interlaced with the second fibers 12 of the base 10 disposed in the Y-axis direction. Resin is impregnated in gaps 13 among the fibers 11 and 12. Generally, each straight line segment of a signal trace 17 is arranged on the PCB 1 at an angle of 0, 45, 90, or −45 degrees relative to the X-axis. In a PCB, some line segments of the signal traces 17 cross the fibers 11 or 12 of the base 10 (such as the line segment of the signal traces 17 arranged at the angles of 45, −45 degrees of FIG. 1), and some line segments of signal traces are coincident with the fibers 11 or 12 of base 10 (such as the line segment of signal traces arranged at the angles of 0, 90 degrees of FIG. 1). There is delay between signals on different signal traces.

What is needed, therefore, is a PCB having little delay time of signals on signal traces laid thereon.

SUMMARY

A printed circuit board includes a base and a signal trace laid on the base. The signal trace includes a plurality of straight line segments parallel to the first fibers. The signal traces are laid on the base in such a manner that the line segments of the signal trace mapped on the base partly superpose the first fibers and partly superpose gaps between two adjacent first fibers.

Other advantages and novel features will be drawn from the following detailed description of embodiments with attached drawings, in which:

DETAILED DESCRIPTION

Figure 1:
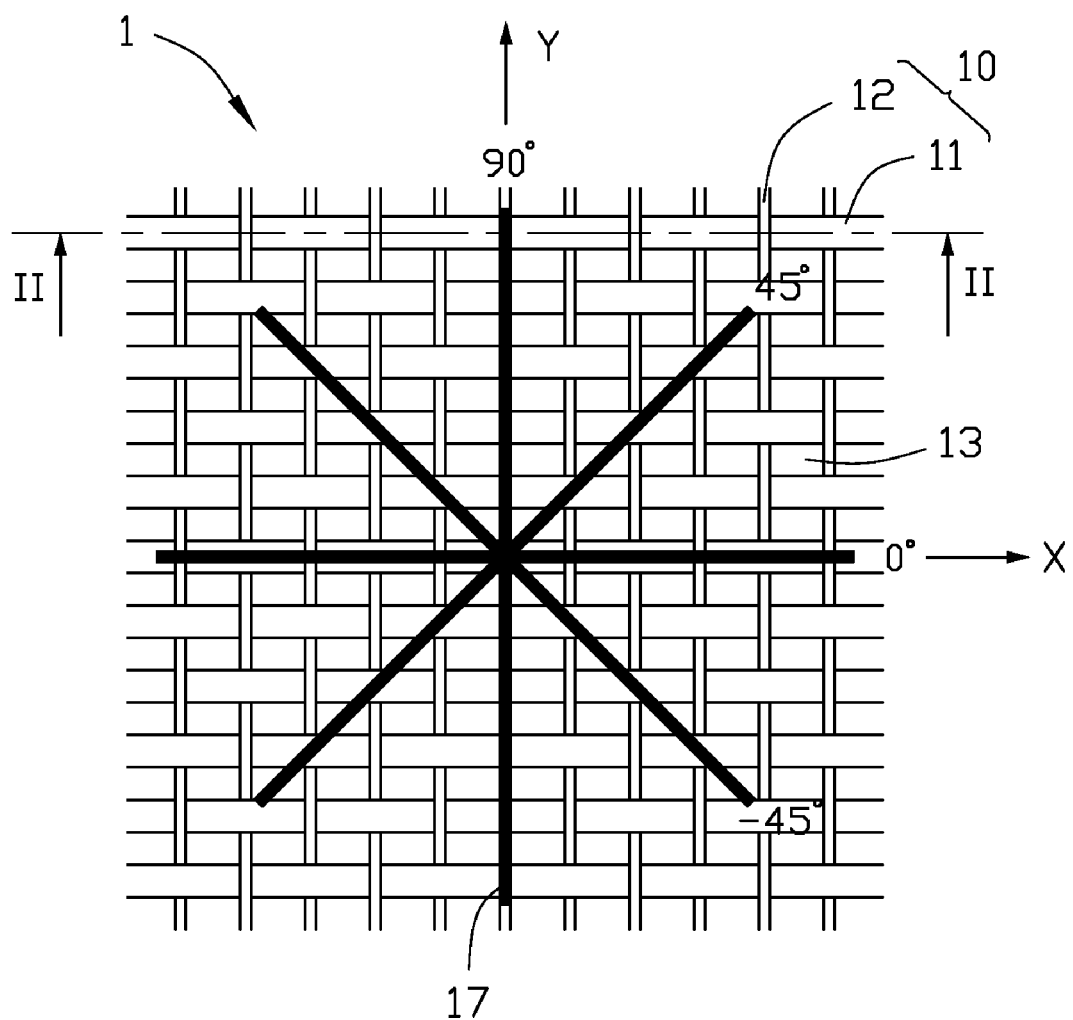
FIG. 1 is a schematic view of a conventional PCB according to the prior art including a base and a plurality of signal traces.
Figure 2:
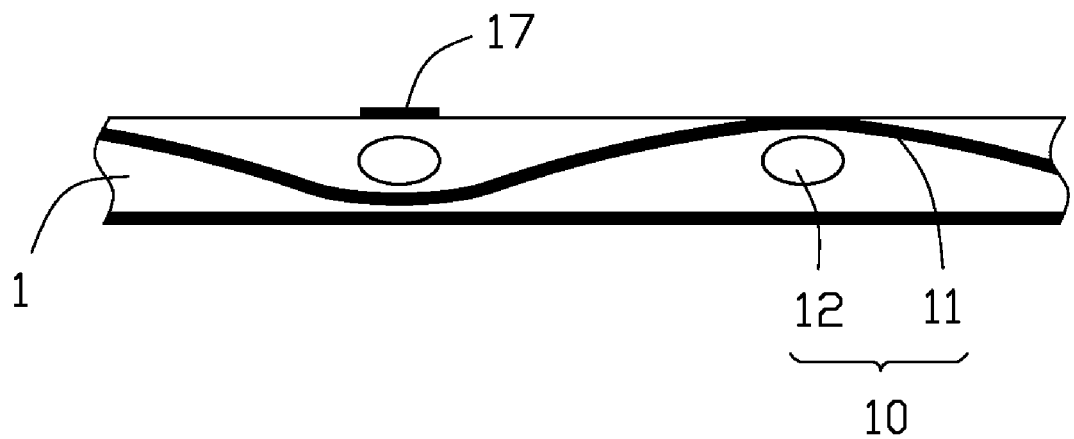
FIG. 2 is a cross sectional view taken along line II-II in FIG. 1 according to the prior art.

Referring to FIGS. 1 and 2, because the fibers 11, 12 and the resin have different dielectric constants, impedances of different signal traces 17 vary over a large range according to the locations and the angles of the line segments of the signal traces 17 relative to the base 10. In a PCB, if the impedances of different signal traces vary greatly, delay time of signals on different signal traces will be very different.

Figure 3:
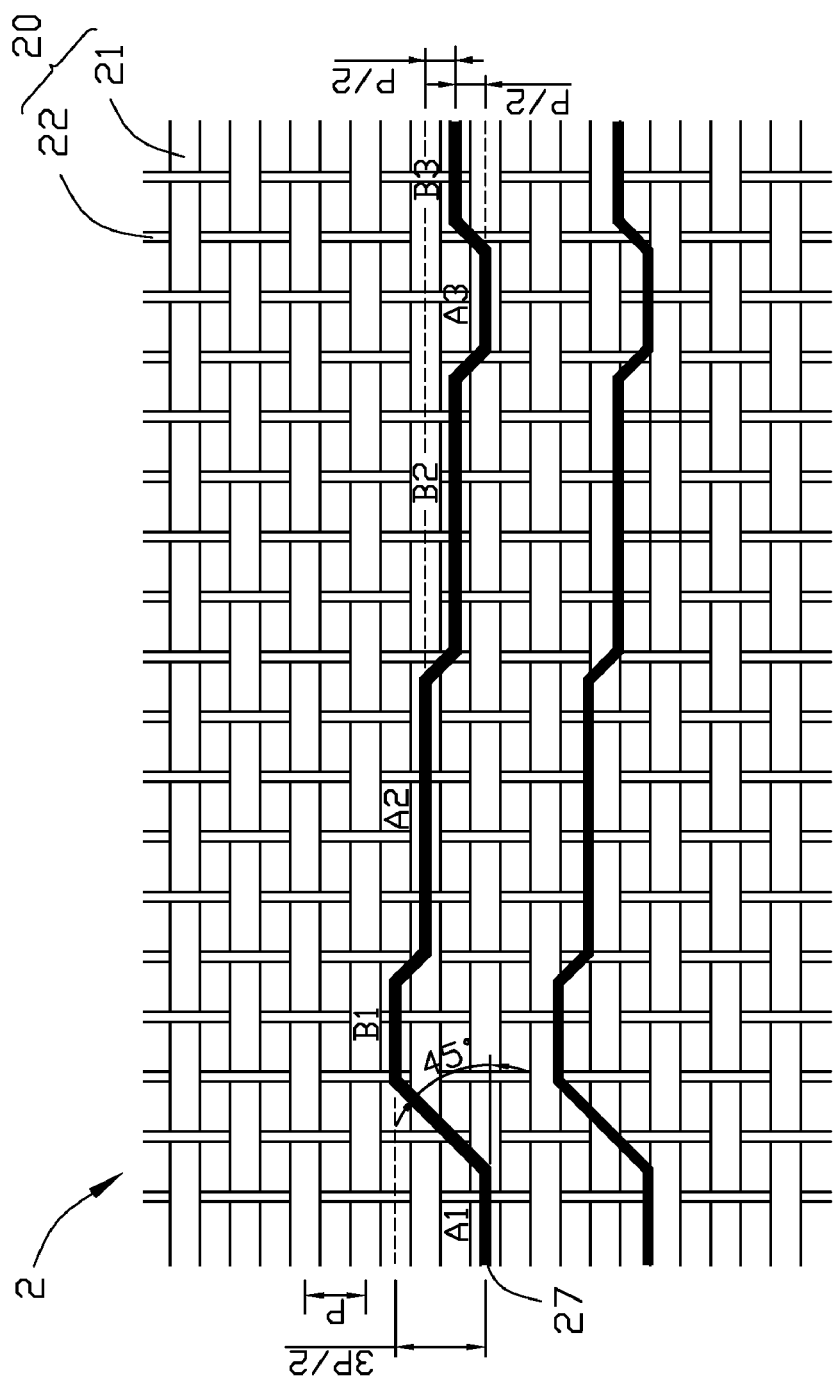
FIG. 3 is a schematic view of a PCB in accordance with a first exemplary embodiment of the present invention.

Referring to FIG. 3, in a first exemplary embodiment of the present invention, a PCB 2 includes a base 20 which includes a set of parallel first fibers 21 and a set of parallel second fibers 22 perpendicular to the set of first fibers 21. Two signal trace 27 are laid on the PCB 2. The signal trace 27 includes a plurality of parallel line segments A1, B1, A2, B2, A3, and B3. The length of the line segment A1 is equal to that of the line segment B1. The length of the line segment A2 is equal to that of the line segment B2. The length of the line segment A3 is equal to that of the line segment B3. The perpendicular distance between centerlines of two adjacent first fibers 21 is P. The perpendicular distance between the centerlines of the line segments A1, B1 is equal to 3P/2. The perpendicular distance between the centerlines of the line segments B1, A2 is equal to P/2. The perpendicular distance between the centerlines of the line segments A2, B2 is equal to P/2. The perpendicular distance between centerlines of the line segments B2, A3 is equal to P/2. The perpendicular distance between the centerlines of the line segments A3, B3 is equal to P/2. A connecting line segment at an angle of 45, or −45 degrees relative to the first fibers 21 is connected between two adjacent line segments of the signal trace 27. It is to be understood that in the above embodiment the signal trace 27 partly superposes the first fibers 21 and partly superposes gaps between two adjacent first fibers 21. So there is little variance between the impedances of two signal traces 27. Therefore, delay time of signals on two signal traces 27 is little, thus ensuring signal transmission quality.

According to the principle of the above embodiment, the perpendicular distance between two adjacent line segments of the signal trace 27 is designed equal to N*P/2, wherein N is an odd number. One of the line segments of the signal trace 27 is defined as a reference line segment. A first set of line segments is laid in the perpendicular distance of M*P away from the reference line segment, wherein M is an integer. A second set of line segments is laid in the perpendicular distance of R*P/2 away from the reference line segment, wherein R is an odd number. The length of the first set of line segments is equal to that of the second set of the line segments. So, in the above embodiment, the length of one of the line segments of the signal trace 27 can be designed equal to the adjacent line segments at both ends of the one of the line segments.

Figure 4:
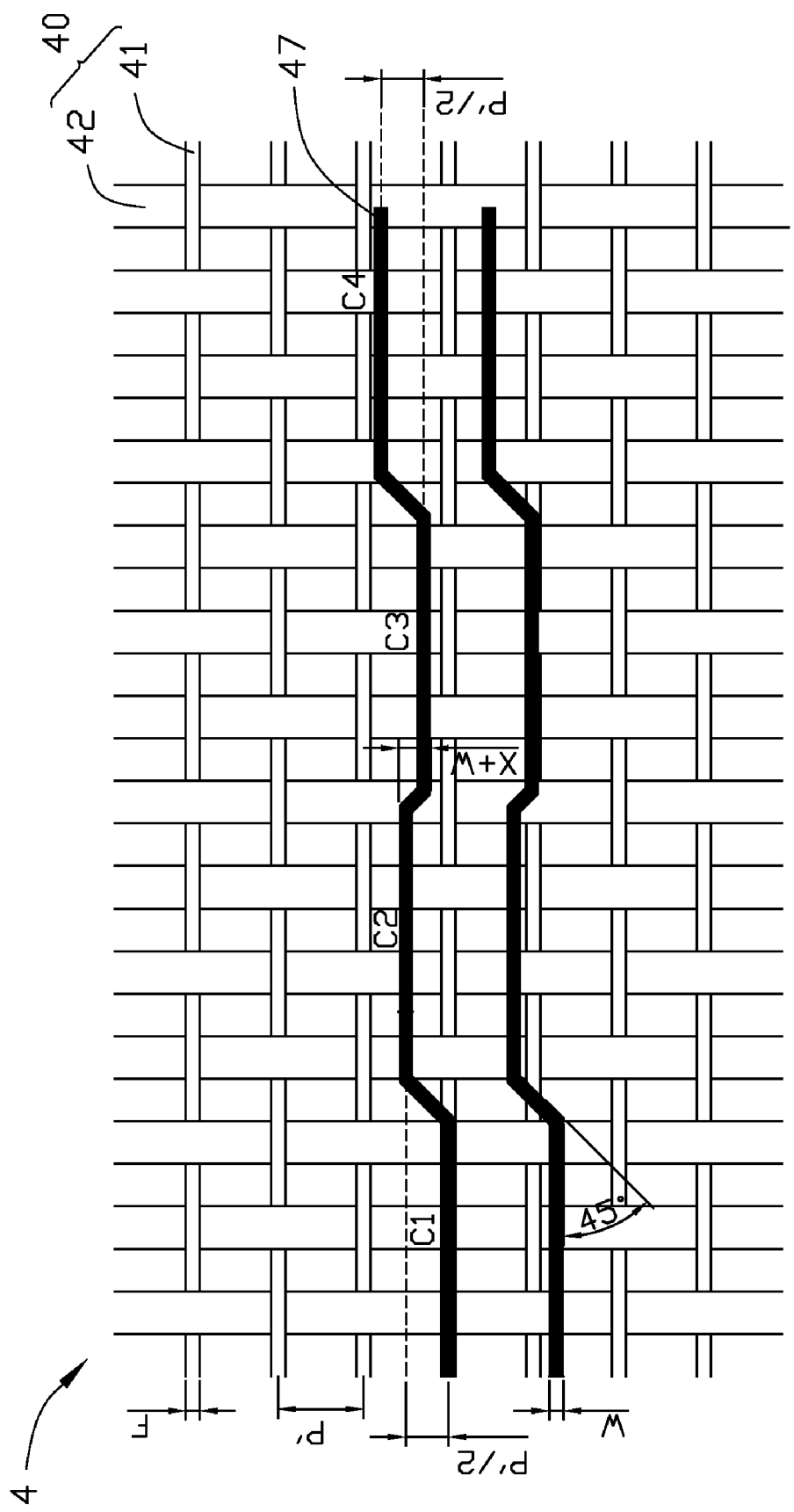
FIG. 4 is a schematic view of a PCB in accordance with a second exemplary embodiment of the present invention, the PCB including a set of parallel fibers each with a width P' and a signal trace with two line segments with a distance of a variable X away from each other.

Referring to FIG. 4, in a second exemplary embodiment of the present invention, a PCB 4 includes a base 40 which includes a set of parallel first fibers 41 and a set of parallel second fibers 42 perpendicular to the set of first fibers 41. Two signal traces 47 are laid on the PCB 4. The signal trace 47 includes a plurality of parallel line segments C1, C2, C3, and C4. The length of the line segment C1 is equal to that of the line segment C2. The length of the line segment C3 is equal to that of the line segment C4. The perpendicular distance between centerlines of two adjacent first fibers 41 is P'. A width of the first fiber 41 is F. A width of the signal trace 47 is W. The perpendicular distance between centerlines of the line segments C1, C2 is equal to P'/2. A variable X is defined as the perpendicular distance between the centerlines of the line segments C3, C2. The perpendicular distance between centerlines of the line segments C4, C3, as shown, is equal to P'/2. A connecting line segment at an angle of 45, or −45 degrees relative to the first fibers 41 is connected between two adjacent line segments of the signal trace 47. The perpendicular distance between an upper edge of the line segment C1 and a lower edge of the line segment C3 is equal to P'/2−W−X, as well as the perpendicular distance between the upper edge of the line segment C2 and the lower edge of the line segment C4. The perpendicular distance between a lower edge of the line segment C2 and an upper edge of the line segment C3 is equal to X−W. The perpendicular distance between a lower edge of the line segment C1 and an upper edge of the line segment C4 is equal to P'+W−X.

Figure 5:
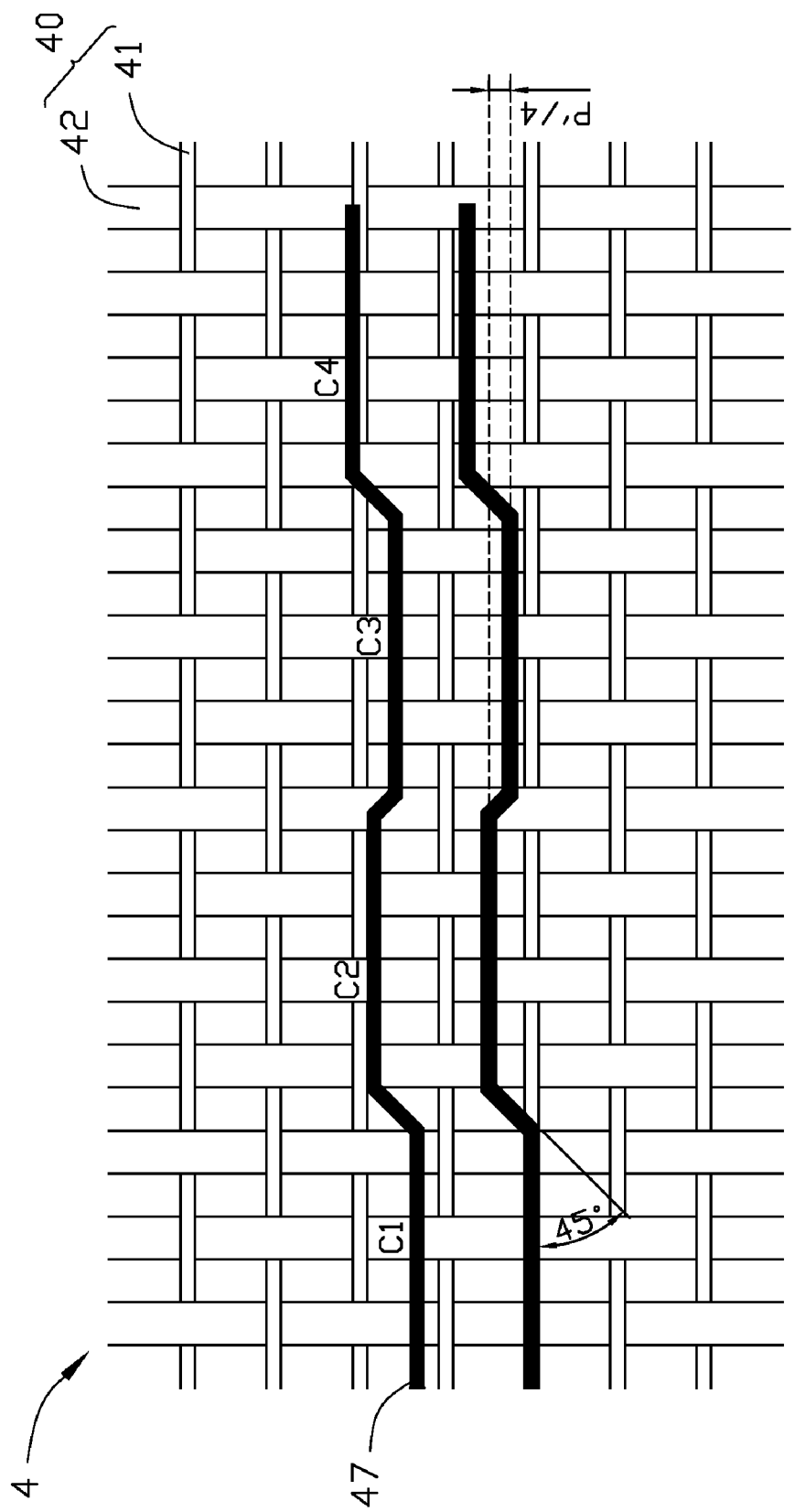
FIG. 5 is a schematic view of the PCB in accordance with the second exemplary embodiment of the present invention when the variable X is equal to P'/2.

When the first fiber 41 is thin, the inequalities: P'/2−W−X<F, X−W<F, and P'+W−X>P'−F are satisfied, which means P' satisfies: 2(W+F)<P'<4(W+F), for enabling the signal trace 47 to be partly superposing the fibers 41 and partly superposing gaps between two adjacent first fibers 41, wherein when the perpendicular distance between centerlines of the line segments C2, C4 is equal to the perpendicular distance between centerlines of the line segments C2, C3, which means the equality: X−W=P'/2−W−X is satisfied, the variable X satisfies: X=P'/4, as shown in FIG. 5.

When the first fiber 41 is large, the inequalities: P'/2−W−X<P'−F, X−W<P'−F, and P'+W−X>F are satisfied, which means P' satisfies: 4(F−W)<P'<2(F−W), for enabling the signal trace 47 to be partly superposing the first fibers 41 and partly superposing gaps between two adjacent first fibers 41. The perpendicular distance between the upper edge of the line segment C1 and the lower edge of the line segment C2 is equal to P'/2−W, and The perpendicular distance between the lower edge of the line segment C1 and the upper edge of the line segment C2 is equal to P'/2+W. If P' satisfies: 2(F−W)<P'<2(F+W), namely P'/2−W<F, and P'/2+W>F, the line segments C1, C2 partly superpose the fibers 41 and partly superpose gaps between two adjacent first fibers 41.

In other words, when P' satisfies: 4(F−W)/3<P'<4(F+W), the signal trace 47 partly superposes the fibers 41 and partly superposes gaps between two adjacent first fibers 41. So there is little variance between the impedances of two signal traces 47. Therefore, delay time of signals on two signal traces 47 is little, thus ensuring signal transmission quality.

Figure 6:
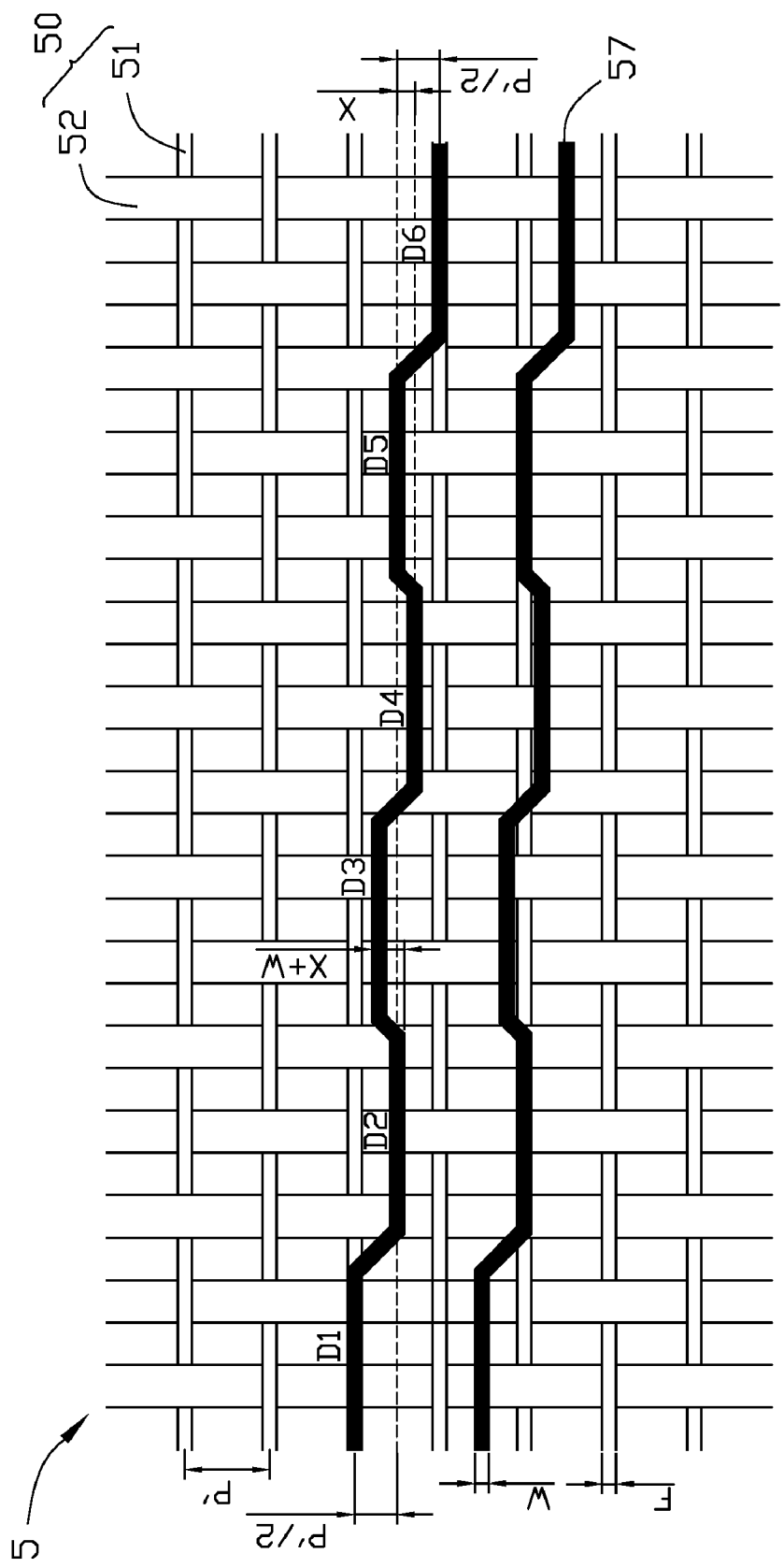
FIG. 6 is a schematic view of a PCB in accordance with the third exemplary embodiment of the present invention.

Referring to FIG. 6, in a third exemplary embodiment of the present invention, a PCB 5 includes an base 50 which includes a set of parallel first fibers 51 and a set of parallel second fibers 52 perpendicular to the set of first fibers 51. Two signal trace 57 are laid on the PCB 5. The signal trace 57 includes a plurality of parallel line segments D1, D2, D3, D4, D5, and D6. The perpendicular distance between centerlines of two adjacent first fibers 41 is P'. A width of the first fiber 51 is F. A width of the signal trace 57 is W. The perpendicular distance between centerlines of the line segments D1, D2 is equal to P'/2. A variable X is defined as the perpendicular distance between centerlines of the line segments D2, D3. The perpendicular distance between centerlines of the line segments D4, D3 is equal to 2X. The perpendicular distance between centerlines of the line segments D5, D4 is equal to X. The perpendicular distance between centerlines of the line segments D6, D5 is equal to P'/2. The line segments D1, D3 are on the same side of the line segment D2. The line segments D4, D6 are on the same side of the line segment D5. A connecting line segments at an angle of 45 or −45 degrees relative to the first fibers 51 is connected between each two adjacent line segments of the signal trace 57. The length of the line segment D1 is equal to that of the line segment D2. The length of the line segment D4 is equal to that of the line segment D3. The length of the line segment D6 is equal to that of the line segment D5. The perpendicular distance between an upper edge of the line segment D3 and a lower edge of line segment D1 is equal to P'/2−W−X, as well as the perpendicular distance between an upper edge of the line segment D6 and a lower edge of line segment D4. The perpendicular distance between a lower edge of the line segment D3 and an upper edge of one of the line segments D2, D5, and the perpendicular distance between a lower edge of the line segment D5 and an upper edge of the line segment D4 are both equal to X−W.

When the first fiber 51 is thin, the inequalities: P'/2−W−X<F, X−W<F are satisfied, which means P' satisfies: 2(W+F)<P'<4(F+W), for enabling the signal trace 57 to be partly superposing the first fibers 51 and partly superposing gaps between two adjacent first fibers 51. When the first fiber 51 is large, the inequalities: P'/2−W−X<P'−F, X−W<P'−F are satisfied, which means P' satisfies: 4(F−W)<P'<2(F−W), for enabling the signal trace 57 to be partly superposing the first fibers 51 and partly superposing gaps between two adjacent first fibers 51. The perpendicular distance between the upper edge of the line segment D1 and the lower edge of the line segment D2 is equal to P'/2+W, and The perpendicular distance between the lower edge of the line segment D1 and the upper edge of the line segment D2 is equal to P'/2−W. If P' satisfies: 2(F−W)<P'<2(F+W), namely P'/2−W<F, and P'/2+W>F, the line segments D1, D2 partly superpose the first fibers 51 and partly superpose gaps between two adjacent first fibers 51.

In other words, when P' satisfies: 4(F−W)/3<P'<4(F+W), the signal trace 57 partly superposes the first fibers 51 and partly superposes gaps between two adjacent first fibers 51. So there is little variance between the impedances of two signal traces 57. Therefore, delay time of signals on two signal traces 57 is little, thus ensuring signal transmission quality.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A printed circuit board, comprising:
    a base formed from a plurality of parallel first fibers and parallel lengthways fibers; and
    a signal trace laid on the base, the signal trace comprising a plurality of straight line segments parallel to the first fibers, the signal trace laid on the base in such a manner that the line segments of the signal trace mapped on the base partly superpose the first fibers and partly superpose gaps between two adjacent first fibers;
    wherein a perpendicular distance between centerlines of two adjacent first fibers being P, a width of the first fiber being F, and a width of the signal trace being W;
    the line segments comprise a first line segment, a second line segment, a third line segment, and a fourth line segment;
    a perpendicular distance between the centerlines of the first line segment and the second line segment being P/2;

a variable X defined as a perpendicular distance between the centerlines of the second line segment and the third line segment;

the first line segment and the third line segment being on the same side of the second line segment, the second line segment and the fourth line segment being on the same side of the third line segment;

a perpendicular distance between the centerlines of the fourth line segment and the third line segment is P/2;

upon the condition that P satisfies: $2(W+F)<P<4(W+F)$, X satisfies: $P/2-W-F<x<P-F+W$;

upon the condition that P satisfies: $4(F-W)/3<P<2(F-W)$, X satisfies: $F-P/2-W<x<P-F+W$.

2. The printed circuit board as described in claim 1, wherein a connecting line segment is connected between two adjacent line segments.

3. The printed circuit board as described in claim 1, wherein the line segments further comprise a fifth line segment and a sixth line segment;

a perpendicular distance between the centerlines of the fourth line segment and the fifth line segment is X, a perpendicular distance between the centerlines of the fifth line segment and the sixth line segment is P/2, the fourth line segment and the sixth line segment being on the same side of the fifth line segment.

4. The printed circuit board as described in claim 3, wherein each line segment is equal to that of at least one of the adjacent line segments.

5. The printed circuit board as described in claim 1, wherein each line segment is equal to that of at least one of the adjacent line segments.

6. A method for producing a printed circuit board, comprising steps of:

providing a base, the base formed of a set of parallel first fibers and a set of parallel second fibers, the first fibers and the second fibers interlaced with each other; and laying a signal trace having a plurality of straight line segments on the base in such a manner that the line segments of the signal trace mapped on the base partly superpose the first fibers and partly superpose gaps between two adjacent first fibers;

wherein a perpendicular distance between centerlines of two adjacent first fibers being P, a width of the first fiber being F, and a width of the signal trace being W;

the line segments comprise a first line segment, a second line segment, a third line segment, and a fourth line segment;

a perpendicular distance between the centerlines of the first line segment and the second line segment being P/2;

a variable X defined as a perpendicular distance between the centerlines of the second line segment and the third line segment;

the first line segment and the third line segment being on the same side of the second line segment;

a perpendicular distance between the centerlines of the fourth line segment and the third line segment is P/2;

upon the condition that P satisfies: $2(W+F)<P<4(W+F)$, the variable X satisfies: $P/2-W-F<x<P-F+W$;

upon the condition that P satisfies: $4(F-W)/3<P<2(F-W)$, the variable X satisfies: $F-P/2-W<x<P-F+W$.

7. The method as described in claim 6, wherein a connecting line segment is connected between two adjacent line segments.

8. The method as described in claim 6, wherein the line segments further comprise a fifth line segment and a sixth line segment;

a perpendicular distance between the centerlines of the fourth line segment and the fifth line segment is X, a perpendicular distance between the centerlines of the fifth line segment and the sixth line segment is P/2;

the fourth line segment and the sixth line segment being on the same side of the fifth line segment.

9. The method as described in claim 8, wherein each line segment is equal to that of at least one of the adjacent line segments.

10. The method as described in claim 6, wherein each line segment is equal to that of at least one of the adjacent line segments.

* * * * *